United States Patent
Lv et al.

(10) Patent No.: US 11,892,499 B2
(45) Date of Patent: Feb. 6, 2024

(54) TESTING MACHINE AND TESTING METHOD

(71) Applicant: CHANGXIN MEMORY TECHNOLOGIES, INC., Hefei (CN)

(72) Inventors: Kang Lv, Hefei (CN); Yang Xiong, Hefei (CN); Jian Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 269 days.

(21) Appl. No.: 17/480,369

(22) Filed: Sep. 21, 2021

(65) Prior Publication Data

US 2022/0196726 A1     Jun. 23, 2022

Related U.S. Application Data

(63) Continuation of application No. PCT/CN2021/103797, filed on Jun. 30, 2021.

(30) Foreign Application Priority Data

Dec. 21, 2020    (CN) .......................... 202011519537.0

(51) Int. Cl.
*G01R 31/28*          (2006.01)
*G01R 31/26*          (2020.01)

(52) U.S. Cl.
CPC ..... *G01R 31/2863* (2013.01); *G01R 31/2642* (2013.01); *G01R 31/2879* (2013.01)

(58) Field of Classification Search
CPC .......... G01R 31/31702; G01R 31/2831; G01R 31/2648; G01R 31/2642; G01R 31/26
See application file for complete search history.

(56) References Cited

U.S. PATENT DOCUMENTS

2004/0008051 A1*   1/2004   Ohkawa ............. G01R 31/2884
                                                      324/750.3
2010/0253380 A1*   10/2010   Martin .................... H01L 22/34
                                                      324/762.01
(Continued)

FOREIGN PATENT DOCUMENTS

CN           1259767 A       7/2000
CN        101865971 A      10/2010
(Continued)

OTHER PUBLICATIONS

Corresponding PCT Patent Application No. PCT/CN2021/103797, International Search Report dated Aug. 30, 2021.

*Primary Examiner* — Tung X Nguyen
(74) *Attorney, Agent, or Firm* — Cooper Legal Group, LLC

(57) ABSTRACT

Embodiments of the present application provide a testing equipment and a testing method. The testing equipment includes: a plurality of pad groups and a plurality of source measure units. Each of the pad groups has a stress pad. The stress pad is configured to connect an element under test. The source measure unit is configured to send an input signal to the element under test through the stress pad and measure an output signal of the element under test to acquire performance parameters of the element under test. The stress pads of at least two of the pad groups are connected to the corresponding source measure units at the same time. The embodiments of the present application help improve the testing efficiency.

16 Claims, 1 Drawing Sheet

(56) References Cited

U.S. PATENT DOCUMENTS

2011/0234252 A1    9/2011  Watanabe et al.
2014/0354325 A1*  12/2014  Chang .................... H01L 22/34
                                                  324/762.09

FOREIGN PATENT DOCUMENTS

| CN | 102338848 A | 2/2012 |
| CN | 102543955 A | 7/2012 |
| CN | 103700598 A | 4/2014 |
| CN | 103837809 A | 6/2014 |
| CN | 204332914 U | 5/2015 |
| CN | 106226671 A | 12/2016 |
| CN | 111679170 A | 9/2020 |

\* cited by examiner

TESTING MACHINE AND TESTING METHOD

CROSS-REFERENCE TO RELATED APPLICATIONS

This application is a continuation application of International Patent Application No. PCT/CN2021/103797, filed on Jun. 30, 2021, which claims priority to Chinese Patent Application No. 202011519537.0, filed with the Chinese Patent Office on Dec. 21, 2020 and entitled "TESTING EQUIPMENT AND TESTING METHOD." International Patent Application No. PCT/CN2021/103797 and Chinese Patent Application No. 202011519537.0 are incorporated herein by reference in their entireties.

TECHNICAL FIELD

Embodiments of the present application relate to the field of semiconductors, and in particular, to a testing equipment and a testing method.

BACKGROUND

Prior to official use, an element is generally required to be tested through a testing equipment to ensure that performance parameters of the element under test meet preset requirements. Current testing equipment are generally a Wafer Level Reliability (WLR) testing equipment and a Package Level Reliability (PLR) testing equipment. The WLR testing equipment can measure only one set of stresses of one set of structures in one test. The PLR testing equipment can measure stresses of a plurality of sets of structures at the same time, but is required to send the element under test out for cutting and packaging before the measurement, and costs, data availability and technical confidentiality thereof are not as good as those of the WLR equipment.

SUMMARY

The embodiments of the present application provide a testing equipment and a testing method, so as to help improve the testing efficiency.

In order to solve the above problem, in one aspect, the embodiments of the present application provide a testing equipment, including: a plurality of pad groups and a plurality of source measure units, each of the pad groups having a stress pad, the stress pad being configured to connect an element under test, the source measure unit being configured to send an input signal to the element under test through the stress pad and measure an output signal of the element under test to acquire performance parameters of the element under test, wherein the stress pads of at least two of the pad groups are connected to the corresponding source measure units at the same time.

Correspondingly, in another aspect, the embodiments of the present application further provide a testing method, including: providing the testing equipment described above; connecting an element under test to at least two pad groups, stress pads of the at least two pad groups being connected to the corresponding source measure units at the same time; and sending an input signal to the element under test and measuring an output signal of the element under test through at least two of the source measure units to acquire performance parameters of the element under test.

BRIEF DESCRIPTION OF DRAWINGS

One or more embodiments are shown by way of example in the figures of the accompanying drawings. The figures in the drawings are not to scale, unless otherwise stated.

DESCRIPTION OF EMBODIMENTS

An existing WLR testing equipment is generally provided with 4 sets of Source Measure Units (SMUs). Each set of source measure units has 6 pins. In actual testing, 24 pins of the 4 sets of source measure units may be simultaneously pinned to 24 pads in testkeys. Each pin corresponds to one pad, and different pins correspond to different pads.

In a default program, only one set of stresses of one set of structures can be measured in a test. That is, only one set of source measure units is required to be enabled, and only the element under test connected to the pins of the enabled source measure units can be effectively tested. However, when a plurality of elements under test are simultaneously connected to the pins of the enabled source measure units, only one element under test can be effectively tested.

Figure 1:
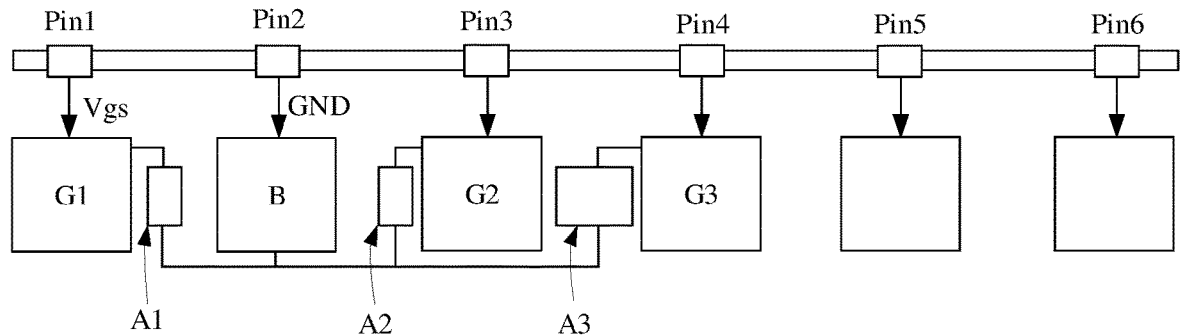
FIG. 1 is a schematic structural diagram of a testing equipment.

Specifically, referring to FIG. 1, the source measure unit includes 6 pins (Pin1, Pin2, Pin3, Pin4, Pin5, Pin6). The six pins are pinned on corresponding pads. The pads include stress pads and ground pads B. The source measure unit sends, through the stress pad, an input signal to an element under test connected thereto, and measures an output signal of the element under test, so as to obtain performance parameters of the element under test.

Generally, the stress pads include a first stress pad G1, a second stress pad G2 and a third stress pad G3. The ground pad B is a common pad. A first element under test A1 is connected in series between the first stress pad G1 and the ground pad B, a second element under test A2 is connected in series between the second stress pad G2 and the ground pad B, and a third element under test A3 is connected in series between the third stress pad G3 and the ground pad B.

Since the source measure unit is generally provided with only one generator and one oscilloscope, the source measure unit can test the performance parameters of only one element under test at the same time. In an example, the first element under test A1 is a transistor, and a failure time performance test is performed on the first element under test A1. During the test, the source measure unit connects the ground pad B to a ground terminal GND through Pin2, and continuously sends, through Pin1, an input signal generated by the generator, i.e., a stress voltage Vgs, to the element under test. During the process of sending the input signal, the output signal of the element under test, that is, a stress current corresponding to the element under test, is measured through the oscilloscope, and then failure time of the first element under test A1 is acquired according to output signals at different times.

During the process of testing the first element under test A1, although the pins corresponding to the second stress pad G2 and the third stress pad G3 are pinned, they are in a suspension state. That is, no valid electrical connection exists between the pins and the pads, or the source measure unit does not send the input signal to the corresponding elements under test through the second stress pad G2 and the third stress pad G3; that is, no test is performed.

At the same time, since Pin3 and Pin4 are in a suspension state, they occupy a space above the second stress pad G2 and the third stress pad G3, and other three idle source measure units in the WLR testing equipment are also unable to effectively test the second element under test A2 and the third element under test A3 connected to the second stress pad G2 and the third stress pad G3. As a result, the second element under test A2 and the third element under test A3 are required to be queued up.

In order to solve the above technical problems, the embodiments of the present application provide a testing equipment and a testing method. The stress pads of the pad groups are adjusted, so that the stress pads of at least two pad groups may be connected to the corresponding source measure units at the same time, and a plurality of sets of source measure units may simultaneously test at least two elements under test connected to the stress pads, which helps improve the testing efficiency of the testing equipment.

In order to make the objectives, technical solutions and advantages of the embodiments of the present application clearer, the embodiments of the present application will be elaborated in detail below with reference to the accompanying drawings. However, those of ordinary skill in the art may understand that, in the embodiments of the present disclosure, numerous technical details are set forth in order to enable a reader to better understand the present application. However, the technical solutions claimed in the present application can be implemented without these technical details and various changes and modifications based on the embodiments below.

Figure 2:
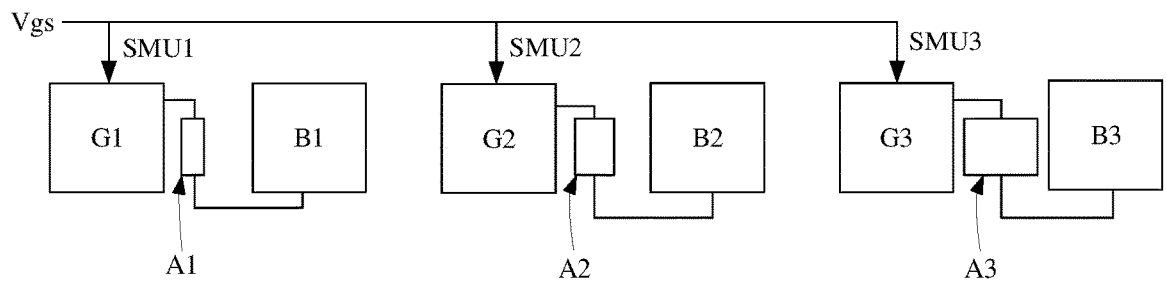
FIG. 2 is a schematic structural diagram of a testing equipment according to an embodiment of the present application.

Referring to FIG. 2, a testing equipment includes: a plurality of pad groups and a plurality of source measure units. Each of the pad groups has a stress pad. The stress pad is configured to connect an element under test. The source measure unit is configured to send an input signal to the element under test through the stress pad and measure an output signal of the element under test to acquire performance parameters of the element under test. The stress pads of at least two of the pad groups are connected to the corresponding source measure units at the same time.

The pad group refers to the stress pad and the ground pad connected to the element under test. The source measure unit corresponding to the stress pad refers to a source measure unit sending, through the stress pad, an input signal to the element under test connected thereto. The input signal includes a stress voltage and a stress current. The output signal includes a voltage value and a current value. It is to be noted that the output signal of the element under test includes not only the output signal of the element under test but also output signals of other elements that can be configured to represent the output signal of the element under test.

For example, a resistor connected in series with the element under test may be connected for failure time testing. Since the stress voltage is given by the source measure unit, the source measure unit can acquire a voltage at two ends of the element under test by measuring a voltage at two ends of the resistor, without directly measuring the voltage at the two ends of the element under test.

In this embodiment, the stress pad of at least one of the pad groups is electrically connected to an accessory pad at another position through a metal lead, so as to be connected to the corresponding source measure unit through the accessory pad. That is, the source measure unit may be connected to the accessory pad to send the input signal to the element under test. The input signal is sent from one end of the accessory pad, and the stress pad acts as a conductor only; therefore, the input signal may be sent in a case where the space above the stress pad is occupied by other source measure units. At the same time, the accessory pad and the stress pad are connected through a metal lead, the stress pad may not limit the position, shape and size of the accessory pad, and the accessory pad has greater flexibility, which helps increase application scenarios of the testing equipment.

Specifically, the testing equipment includes a first stress pad G1, a second stress pad G2 and a third stress pad G3. The second stress pad G2 is connected to a corresponding first accessory pad (not shown) through a metal lead. The third stress pad G3 is connected to a corresponding second accessory pad (not shown) through a metal lead. The first element under test A1 is connected to the first stress pad G1, the second element under test A2 is connected to the second stress pad G2, and the third element under test A3 is connected to the third stress pad G3.

When the first element under test A1 is tested through a first source measure unit SMU1, a pin of the first source measure unit SMU1 is suspended above the second stress pad G2 and the third stress pad G3. A space above the second stress pad G2 and the third stress pad G3 is occupied, a pin of a second source measure unit SMU2 cannot directly contact the second stress pad G2 to send the input signal, and a pin of the third source measure unit SMU3 cannot directly contact the third stress pad G3 to send the input signal. After the accessory pad is provided, the pin of the second source measure unit SMU2 may be directly connected to the first accessory pad, and the input signal is sent to the second element under test A2 through the first accessory pad. Similarly, the pin of the third source measure unit SMU3 may be directly connected to the second accessory pad, and the input signal is sent to the third element under test A3 through the second accessory pad.

In this embodiment, a receiving channel of the input signal is added by connecting other accessory pads, so that the input signal can still be received through other channels and the corresponding test can be performed even when the space above the stress pad is occupied. In other embodiments, the first source measure unit may occupy only part of a space above the second stress pad by changing a shape of the second stress pad, and then the pin of the second source measure unit directly contacts the second stress pad through the remaining space.

When improvement is made by adopting the solution of adjusting the shape of the stress pad, since there is no need to change the shape of the first stress pad, the shape of the first stress pad is different from that of the second stress pad. Similarly, the shape of the first stress pad is also different from that of the third stress pad; that is, the stress pads of at least two pad groups are in different shapes.

In this embodiment, a number of the pad group connected to the accessory pad is less than that of the source measure unit. Specifically, since the first stress pad G1 does not require a corresponding accessory pad, in a case where the number of the source measure unit is N, simultaneous operation of N source measure units can be realized only through connections between N−1 stress pads and the corresponding accessory pads. Reduction of unnecessary accessory pads helps reduce a size and a space occupied by the testkey and lowers test difficulty and a demand for a test space.

In this embodiment, the number of the source measure unit is 4. In other embodiments, the number of the source measure unit may be adjusted according to a maximum space occupied by the testkey. Specifically, the larger the maximum space occupied by the testkey, the greater the number of stress pads in the testkey that can be connected to the source measure unit simultaneously, the greater the number of elements under test that can be tested simultaneously, and the more the source measure units required.

In this embodiment, the plurality of pad groups include a first pad group and a second pad group, the first stress pad G1 of the first pad group and the second stress pad G2 of the second pad group are connected to the corresponding source measure units at the same time, the first pad group has a first ground pad B1, the second pad group has a second ground pad B2, and the first ground pad B1 and the second ground pad B2 are configured to connect the element under test and be grounded.

The first ground pad B1 and the second ground pad B2 may be provided with a grounding voltage by the first source measure unit SMU1, or the first source measure unit SMU1 provides a grounding voltage for the first ground pad B1 and the second source measure unit SMU2 provides a grounding voltage for the second ground pad B2.

When the performance parameters of the element under test are measured, a defect such as breakdown may occur in the ground pad. If the ground pad is simultaneously connected to two elements under test and the two elements under test are tested at the same time, the defect caused by the measurement of one element under test may affect the measurement of the other element under test and then lead to measurement failure or an incorrect measurement result of the other element under test. A plurality of pad groups tested at the same time are controlled to have respective different ground pads, which helps ensure the accuracy of test results, improve testing efficiency and reduce test costs.

The pad groups may be configured to perform various types of tests, such as time dependent dielectric breakdown tests and hot carrier effect tests. The time dependent dielectric breakdown tests are also referred to as dielectric breakdown tests. Correspondingly, due to different test conditions, there are many possible factors leading to defects such as breakdown of the ground pad. For example, the source measure unit may continuously increase the magnitude of the stress voltage to measure gate-oxide insulation capability. When the stress voltage is high enough, simultaneous breakdown of a dielectric material and the ground pad may be caused.

During the above discussion, the defects in the ground pad are repairable by default, even only transient and/or automatically repairable. Therefore, it is considered that the defects in the ground pad may affect only ongoing tests. Specifically, assuming that the first element under test and the second element under test are tested at the same time and are connected to a same ground pad, when there is a problem with the test of the first element under test that causes a defect in the ground pad, the defect in the ground pad may affect only the ongoing test of the second element under test and may not affect the subsequent test of the third element under test connected to the ground pad.

In other words, when the defect in the ground pad is repairable, the subsequent measurement of the element under test does not take into account the defect caused by the previous measurement. In this case, the plurality of pad groups further include a fourth pad group, the element under test connected to the stress pad of the fourth pad group is connected to the first ground pad B1, and the fourth stress pad of the fourth pad group and the second stress pad G2 of the second pad group are connected to the corresponding source measure units at the same time.

When the first stress pad G1 cannot be used, the measurement of at least two elements under test can be performed simultaneously through the fourth stress pad and the second stress pad. Since the previous defects in the first ground pad have no effect on the subsequent measurement, measurement results performed through the fourth stress pad and the first ground pad B1 are accurate. Moreover, since the fourth pad group and the first pad group share the first ground pad, the size of the test key is effectively reduced, which helps reduce manufacturing costs of the test key and reduce the test difficulty.

Conversely, when the defect in the ground pad is permanent, in order to avoid the effect of the defect on the subsequent measurement, each of the plurality of pad groups should have a corresponding ground pad, and different pad groups correspond to different ground pads.

During an actual application, an application scenario of the test key may be fixed. That is, a test key is always configured to measure one or more specific performance parameters, and then customized according to application scenarios of different test keys.

In this embodiment, the element under test includes an external gate oxide structure Peri. gate, a transistor and a memory array. During measurement of the transistor, generally, a gate is connected to the stress pad, and a source, a drain and a substrate are grounded. During measurement of the memory array, generally, a scanning line WLA is connected to the stress pad, and a data line DLA is grounded.

In this embodiment, the stress pads of the pad groups are adjusted, so that the stress pads of at least two pad groups may be connected to the corresponding source measure units at the same time, and a plurality of sets of source measure units may simultaneously test at least two elements under test connected to the stress pads, which helps improve the testing efficiency of the testing equipment.

Correspondingly, an embodiment of the present application further provides a testing method, including: providing the testing equipment described above; connecting an element under test to at least two pad groups, stress pads of the at least two pad groups being connected to the corresponding source measure units at the same time; and sending an input signal to the element under test and measuring an output signal of the element under test through at least two of the source measure units to acquire performance parameters of the element under test.

In this embodiment, the performance parameters include failure time; at least two elements under test with different performance parameters are connected to the at least two pad groups; and prior to the step of measuring an output signal of the element under test, the testing method further includes: setting maximum measurement time, the maximum measurement time being longer than or equal to maximum failure time of the element under test. In this way, the measurement time can be saved and meaningless measurement can be avoided after the failure time of the element under test is acquired. Meanwhile, acquisition of the failure time of all elements under test can be guaranteed.

In this embodiment, the failure time includes gate dielectric breakdown time, and gate dielectric layers of a plurality of elements under test have a same thickness but different areas. In other embodiments, the gate dielectric layers have a same area but different thicknesses, or the gate dielectric layers are the same and stress voltages applied to different elements under test vary.

In an example, the element under test includes a gate oxide structure and time dependent dielectric breakdown (TDDB) testing is performed on the element under test.

Figure 3:
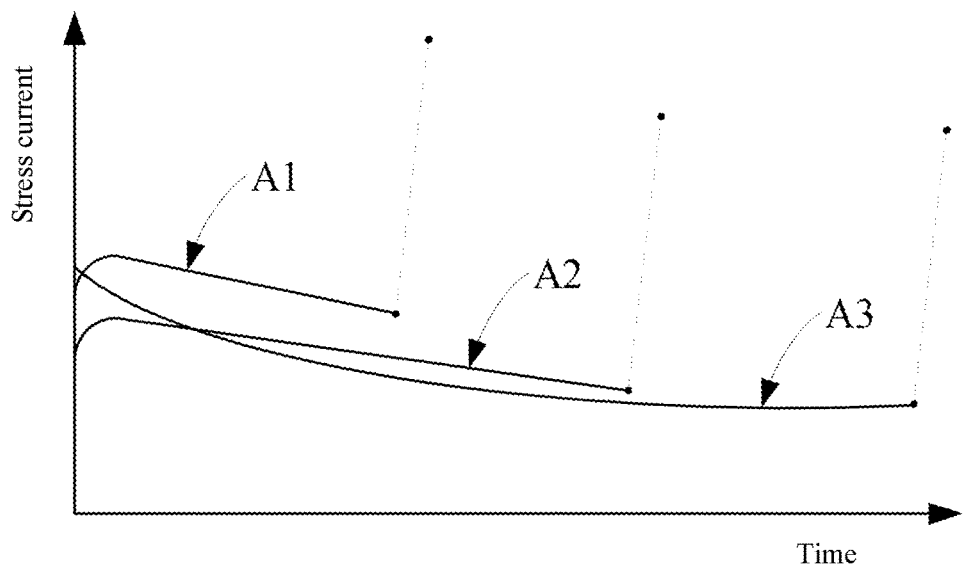
FIG. 3 is a schematic diagram of time vs. stress current according to an embodiment of the present application.

In this embodiment, referring to FIG. 2 and FIG. 3, a same stress voltage Vgs is sent to three source measure units (the first source measure unit SMU1, the second source measure unit SMU2 and the third source measure unit SMU3) through a same power supply, and the same stress voltage Vgs is sent to three elements under test (the first element under test A1, the second element under test A2 and the third element under test A3) through the three source measure units. A gate oxide area of the third element under test A3 is greater than a gate oxide area of the second element under test A2 which is greater than a gate oxide area of the first element under test A1, and different elements under test have a same thickness.

When the constant stress voltage Vgs is continuously applied to a gate of the element under test, the element under test is in an accumulation state. In this case, stress currents of different elements under test are measured, and measurement results corresponding to the different elements under test can be obtained. After a period of time, the gate oxide may be broken down and the stress current may change suddenly. The time from the application of the stress voltage to the breakdown is the failure time of the element under test.

In other application scenarios, a same input signal is sent to at least two of the source measure units through a same power supply, and the same input signal is sent to at least two elements under test through the at least two source measure units.

In this embodiment, the element under test is a model element, and after performance parameters of the model element are measured, performance parameters of a functional element are acquired according to an area ratio of the functional element to the model element. Taking a gate oxide area as an example, generally, a gate oxide area of the functional element is greater than that of the model element, and the area ratio of the functional element to the model element is generally referred to as an area acceleration factor.

In this embodiment, the stress pads of the pad groups are adjusted, so that the stress pads of at least two pad groups may be connected to the corresponding source measure units at the same time, and a plurality of sets of source measure units may simultaneously test at least two elements under test connected to the stress pads, so as to improve the testing efficiency of the testing equipment.

Those of ordinary skill in the art may understand that the above embodiments are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A testing equipment, comprising:
a plurality of pad groups and a plurality of source measure units, each of the pad groups having a stress pad, the stress pad being configured to connect an element under test, a corresponding source measure unit of the source measure units being configured to send an input signal to the element under test through the stress pad and measure an output signal of the element under test to acquire performance parameters of the element under test, wherein the stress pads of at least two of the pad groups are connected to the corresponding source measure units a same time;
wherein the stress pad of at least one of the pad groups is electrically connected to an accessory pad at another position through a metal lead, so as to be connected to the corresponding source measure unit through the accessory pad.

2. The testing equipment according to claim 1, wherein the stress pads of the at least two of the pad groups are of different shapes.

3. The testing equipment according to claim 1, wherein a number of the pad groups connected to the accessory pad is less than that of the source measure units.

4. The testing equipment according to claim 1, wherein a number of the source measure units is 4.

5. The testing equipment according to claim 1, wherein the pad groups comprise a first pad group and a second pad group, the stress pad of the first pad group and the stress pad of the second pad group are connected to the corresponding source measure units at the same time, the first pad group has a first ground pad, the second pad group has a second ground pad, and the first ground pad and the second ground pad are configured to connect the element under test and be grounded.

6. The testing equipment according to claim 5, wherein the pad groups further comprise a third pad group, the element under test connected to the stress pad of the third pad group is connected to the first ground pad, and the stress pad of the third pad group and the stress pad of the second pad group are connected to the corresponding source measure units at the same time.

7. The testing equipment according to claim 5, wherein each of the pad groups has a corresponding ground pad, and different pad groups correspond to different ground pads.

8. The testing equipment according to claim 1, wherein the element under test comprises a transistor or a memory array.

9. A testing method, comprising:
providing the testing equipment according to claim 1;
connecting the element under test to the at least two of the pad groups, the stress pads of the at least two of the pad groups being connected to the corresponding source measure units at the same time; and
sending the input signal to the element under test and measuring llanllthe output signal of the element under test through at least two of the source measure units to acquire the performance parameters of the element under test.

10. The testing method according to claim 9, wherein the performance parameters comprise failure time; at least two elements under test with different performance parameters are connected to the at least two of the pad groups; and prior to the step of measuring the output signal of the element under test, the testing method further comprises: setting maximum measurement time, the maximum measurement time being longer than or equal to maximum failure time of the element under test.

11. The testing method according to claim 10, wherein the failure time comprises gate dielectric breakdown time.

12. The testing method according to claim 10, wherein gate dielectric layers of the at least two elements under test have a same thickness but different areas.

13. The testing method according to claim 9, wherein a same input signal is sent to the at least two of the source measure units through a same power supply, and the same input signal is sent to at least two elements under test through the at least two of the source measure units.

14. The testing method according to claim 9, wherein the element under test is a model element, and after performance parameters of the model element are measured, performance parameters of a functional element are acquired according to an area ratio of the functional element to the model element.

15. The testing equipment according to claim 3, wherein a number of the source measure unit is 4.

16. A testing equipment, comprising:
a plurality of pad groups and a plurality of source measure units, each of the pad groups having a stress pad, the stress pad being configured to connect an element under test, a corresponding source measure unit of the source measure units being configured to send an input signal to the element under test through the stress pad and measure an output signal of the element under test to acquire performance parameters of the element under test, wherein the stress pads of at least two of the pad groups are connected to the corresponding source measure units at a same time; and
wherein the pad groups comprise a first pad group and a second pad group, the stress pad of the first pad group and the stress pad of the second pad group are connected to the corresponding source measure units at the same time, the first pad group has a first ground pad, the second pad group has a second ground pad, and the first ground pad and the second ground pad are configured to connect the element under test and be grounded.

* * * * *